US012783758B2

(12) United States Patent
Kuo et al.

(10) Patent No.: US 12,783,758 B2
(45) Date of Patent: Nov. 3, 2026

(54) LEARNING-BASED MACRO PLACEMENT WITH QUALITY OF HUMAN EXPERTS

(71) Applicant: MediaTek Inc., Hsinchu City (TW)

(72) Inventors: Hsin-Chuan Kuo, Hsinchu City (TW); Chia-Wei Chen, Hsinchu City (TW); Yu-Hsiu Lin, Hsinchu City (TW); Kun-Yu Wang, Hsinchu City (TW); Sheng-Tai Tseng, Hsinchu City (TW); Chun-Ku Ting, Hsinchu City (TW); Fang-Ming Yang, Hsinchu City (TW); Yu-Hsien Ku, Hsinchu City (TW); Jen-Wei Lee, Hsinchu City (TW); Ronald Kuo-Hua Ho, Hsinchu City (TW); Chun-Chieh Wang, Hsinchu City (TW); Yi-Ying Liao, Hsinchu City (TW); Tai-Lai Tung, Hsinchu City (TW); Ming-Fang Tsai, Hsinchu City (TW); Chun-Chih Yang, Hsinchu City (TW); Chih-Wei Ko, Hsinchu City (TW); Kun-Chin Huang, Hsinchu City (TW)

(73) Assignee: MediaTek Inc., Hsinchu City (TW)

( * ) Notice: Subject to any disclaimer, the term of this patent is extended or adjusted under 35 U.S.C. 154(b) by 779 days.

(21) Appl. No.: 18/315,904

(22) Filed: May 11, 2023

(65) Prior Publication Data

US 2023/0376653 A1 Nov. 23, 2023

Related U.S. Application Data

(60) Provisional application No. 63/373,207, filed on Aug. 23, 2022, provisional application No. 63/343,111, filed on May 18, 2022.

(51) Int. Cl.
*G06F 30/392* (2020.01)
*G06F 30/27* (2020.01)

(52) U.S. Cl.
CPC ............ *G06F 30/27* (2020.01); *G06F 30/392* (2020.01)

(58) Field of Classification Search
CPC ................................ G06F 30/27; G06F 30/392
See application file for complete search history.

(56) References Cited

U.S. PATENT DOCUMENTS 7,512,921 B2 * 3/2009 Shibuya ................ G06F 30/392 716/135
10,699,043 B2 6/2020 Ho
(Continued)

FOREIGN PATENT DOCUMENTS

CN 114372438 A 4/2022

OTHER PUBLICATIONS

Mirhoseini et al., Chip Placement with Deep Reinforcement Learning, Apr. 22, 2020, pp. 1-15 (Year: 2020).*
(Continued)

*Primary Examiner* — Nghia M Doan
(74) *Attorney, Agent, or Firm* — Tong J. Lee

(57) ABSTRACT

A neural network is used to place macros on a chip canvas in an integrated circuit (IC) design. The macros are first clustered into multiple macro clusters. Then the neural network generates a probability distribution over locations on a grid and aspect ratios of a macro cluster. The grid represents the chip canvas and is formed by rows and columns of grid cells. The macro cluster is described by at least an area size, aspect ratios, and wire connections. Action masks are generated for respective ones of the aspect ratios to block out a subset of unoccupied grid cells based on design rules that optimize macro placement. Then, by applying the action masks on the probability distribution, a masked probability distribution is generated. Based on the masked probability distribution, a location on the grid is
(Continued)

selected for placing the macro cluster with a chosen aspect ratio.

20 Claims, 8 Drawing Sheets

(56) References Cited

U.S. PATENT DOCUMENTS

| | | | | |
|---|---|---|---|---|
| 2016/0335386 | A1* | 11/2016 | Hsu | G06F 30/392 |
| 2023/0376671 | A1* | 11/2023 | Lee | G06F 30/392 |

OTHER PUBLICATIONS

J. Schulman et al. "Proximal Policy Optimization Algorithms," arXiv:1707.06347v2 [cs.LG], Aug. 28, 2017.

* cited by examiner

| | | |
|---|---|---|
| hierarchy 0 | cluster 0 | A D E |
| | cluster 1 | B C |
| hierarchy 1 | cluster 2 | F G J |
| | cluster 3 | H I |

| | | |
|---|---|---|
| hierarchy 0 | cluster 0 | A |
| hierarchy 1 | cluster 1 | B C |
| | cluster 2 | D E |
| hierarchy 2 | cluster 3 | F G |
| hierarchy 3 | cluster 4 | H I |
| | cluster 5 | J |

| **Convex Refiner for Macro Placement** | |
|---|---|
| 1. | Given the macro information and locations (obtained from RL); blockage information and locations (i.e., pre-placed macros and/or non-power region); and the canvas information, in which information contains width, height, and numbers. |
| 2. | Compute horizontal and vertical constraint graph (i.e., $\mathcal{H}$ and $\mathcal{V}$) for macros and blockages. |
| 3. | Calculate left-most, right-most, down-most, and up-most non-overlapping locations and slacks for all macros. |
| 4. | If there is a macro with the left-most location exceeds canvas width, then move some connection in $\mathcal{H}$ to $\mathcal{V}$. |
| 5. | If there is a macro with the down-most location exceeds canvas height, then move some connection in $\mathcal{V}$ to $\mathcal{H}$. |
| 6. | Do **Step 4** and **Step 5** iteratively while some macro exceeds canvas. |
| 7. | Given the obtained valid sets of $\mathcal{H}$ and $\mathcal{V}$, solve the convex optimization problem and compute the displacement. |

- Macro $m$ with width $w_m$ and height $h_m$.
- Macro $m$ with center coordinate $(x_m^{old}, y_m^{old})$ at RL placer output and $(x_m^{new}, y_m^{new})$ at Convex Refiner output.
- Canvas width $W$ and height $H$.

- $min_{\{x_m^{new}, y_m^{new}\}} \sum_{m=0}^{M-1} \left|x_m^{new} - x_m^{old}\right| + \left|y_m^{new} - y_m^{old}\right|$

*Subject to*

- $\frac{w_m}{2} \leq x_m^{new} \leq W - \frac{w_m}{2}$, for all $m$
- $\frac{h_m}{2} \leq y_m^{new} \leq H - \frac{h_m}{2}$, for all $m$
- $x_n^{new} - x_m^{new} \geq \frac{w_m + w_n}{2}$ for all $m \to n \in \mathcal{H}$
- $y_{n'}^{new} - y_{m'}^{new} \geq \frac{h_{m'} + h_{n'}}{2}$ for all $m' \to n' \in \mathcal{V}$

FIG. 10

LEARNING-BASED MACRO PLACEMENT WITH QUALITY OF HUMAN EXPERTS

CROSS-REFERENCE TO RELATED APPLICATIONS

This application claims the benefit of U.S. Provisional Application No. 63/343,111 filed on May 18, 2022, and U.S. Provisional Application No. 63/373,207 filed on Aug. 23, 2022, the entirety of both which is incorporated by reference herein.

TECHNICAL FIELD

Embodiments of the invention relate to methods and apparatuses based on machine learning for placing circuit blocks with flexible aspect ratios on a semiconductor chip.

BACKGROUND OF THE INVENTION

In integrated circuit (IC) design, macro placement is the process of placing circuit blocks on a chip canvas. A macro contains post-synthesized descriptions of a circuit block. The logic and electronic behavior of the macro are given but the internal structural description may or may not be known. Mixed-size macro placement is the problem of placing macros of various sizes on a chip canvas to optimize an objective such as the wirelength, congestion, etc.

The number of circuit blocks involved in the placement can be on the order of hundreds or thousands. The placement of circuit blocks is a complicated and time-consuming process and typically relies on the manual efforts of human experts. The reliance on manual efforts severely limits the number of placement options that can be explored within a reasonable time. As a result, the manual placement may be suboptimal. If the chip design later calls for a different placement, the high iteration cost and impact on the schedule and resources would be prohibitive. Thus, there is a need to improve the quality and efficiency of circuit block placement.

SUMMARY OF THE INVENTION

In one embodiment, a method is provided for placing macros by a neural network on a chip canvas in an IC design. The method includes the steps of clustering the macros into multiple macro clusters, and generating, using the neural network, a probability distribution over locations on a grid and aspect ratios of a macro cluster. The grid represents the chip canvas and is formed by rows and columns of grid cells, and the macro cluster is described by at least an area size, aspect ratios, and wire connections. The method further includes the steps of generating action masks for respective ones of the aspect ratios to block out a subset of unoccupied grid cells based on design rules that optimize macro placement, generating a masked probability distribution by applying the action masks on the probability distribution, and selecting a location on the grid for placing the macro cluster with a chosen aspect ratio based on the masked probability distribution.

In another embodiment, a system is provided for placing macros on a chip canvas in an IC design. The system includes memory to store descriptions of the macros, and one or more processors coupled to the memory. At least one of the processors is operative to perform operations of a neural network. The one or more processors are operative to cluster the macros into multiple macro clusters, and generate, using the neural network, a probability distribution over locations on a grid and aspect ratios of a macro cluster. The grid represents the chip canvas and is formed by rows and columns of grid cells, and the macro cluster is described by at least an area size, aspect ratios, and wire connections. The one or more processors are further operative to generate action masks for respective ones of the aspect ratios to block out a subset of unoccupied grid cells based on design rules that optimize macro placement, generate a masked probability distribution by applying the action masks on the probability distribution, and select a location on the grid for placing the macro cluster with a chosen aspect ratio based on the masked probability distribution.

Other aspects and features will become apparent to those ordinarily skilled in the art upon review of the following description of specific embodiments in conjunction with the accompanying figures.

BRIEF DESCRIPTION OF DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIG. 10 illustrates an example of de-overlapping macros according to one embodiment.

DETAILED DESCRIPTION OF THE INVENTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

This disclosure describes a macro placer that is based on reinforcement learning (RL) and incorporates design principles followed by circuit designers. The macro placer is driven by a reward to reduce routing wirelength and congestion, with human experts' design principles incorporated as constraints in an RL environment. The macro placer can place hundreds of macros within a few hours with the quality of human experts. A macro is a circuit block, which may be a circuit module coded in a register transfer language (RTL) or a post-synthesized circuit module. One example of a macro is a memory circuit such as static random access memory (SRAM).

A common goal of macro placement is to minimize wirelength, congestion, power, and area for the placement. In addition to the common goal, circuit designers also follow design principles, such as placing macros at the periphery, avoiding dead space (i.e., areas that cannot be used effectively by electronic design automatic (EDA) tools), choosing regularity of the placement, etc.

The learning-based macro placer disclosed herein aims at the common goal and incorporates circuit designers' design principles as constraints in the RL learning environment to achieve the quality of human experts. The macro placer determines the shape (e.g., the aspect ratio, which is the ratio of width to height of a rectangle) of each macro cluster and places the macro cluster in an optimal location. Furthermore, a convex optimization refiner and a rule-based refiner are applied to de-overlap and refine the macros' positions to comply with the chip integration checker (CIC) rule. Therefore, the next stage of place-and-route for standard cells can start immediately without additional manual fine-tuning.

Figure 1:
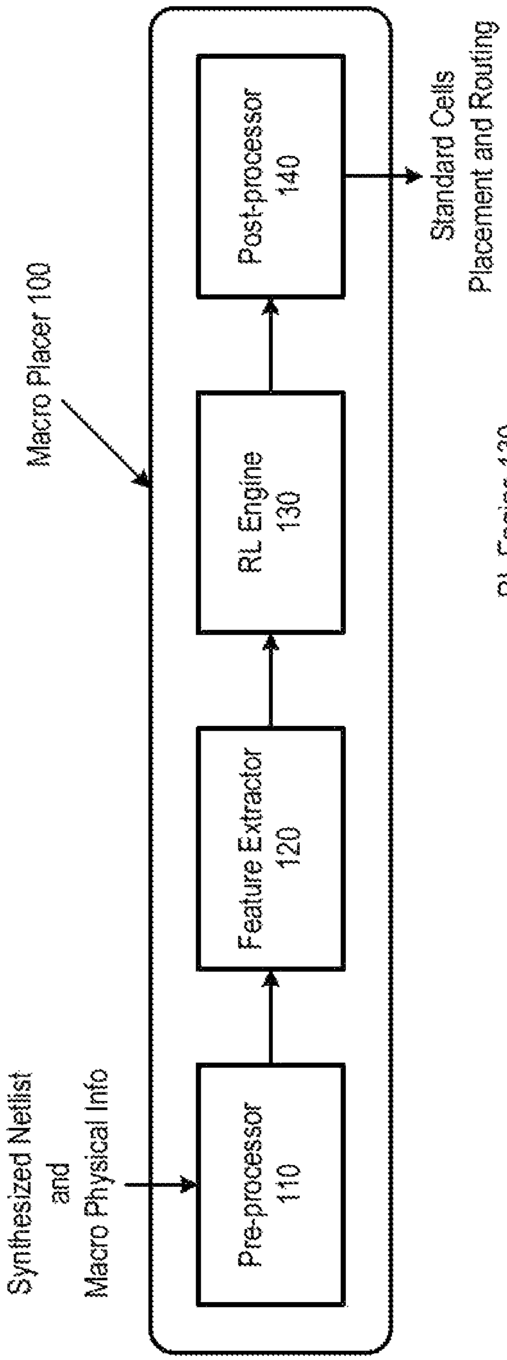
FIG. 1 is a block diagram illustrating a learning-based macro placer according to one embodiment.

FIG. 1 is a block diagram illustrating a learning-based macro placement module ("macro placer 100") according to one embodiment. Macro placer 100 includes a neural network trained by reinforcement learning to place macro clusters on a chip canvas. Macro placer 100 receives an input including a synthesized netlist and physical information of macros, such as the area size, shape, wire connections, and power domain of each macro. A pre-processor 110 pre-processes the input and a feature extractor 120 condenses the pre-processed input into embedded vectors. An RL agent 130 places the macro clusters onto a chip canvas and the placement is fed to a post-processor 140, which adjusts the placement to remove overlaps and to comply with the CIC rules. Subsequently, commercial EDA tools may be used to perform the placement of standard cell clusters and global routing.

Figure 2:
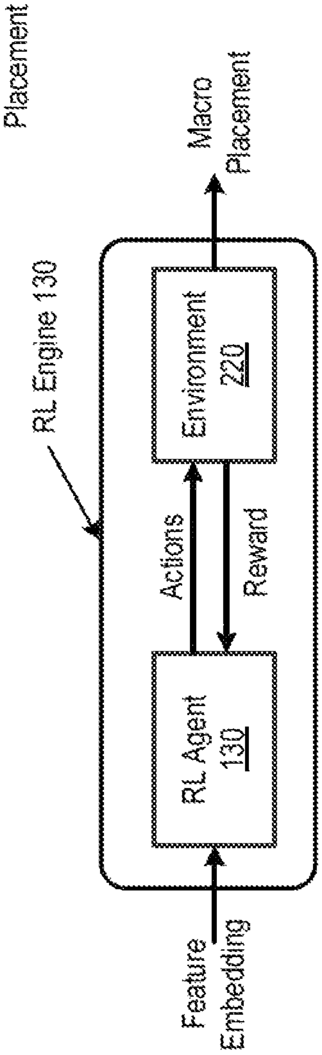
FIG. 2 is a block diagram illustrating reinforcement learning (RL) for macro placement according to one embodiment.

FIG. 2 is a block diagram illustrating reinforcement learning (RL) for macro placement according to one embodiment. Referring also to FIG. 1, RL agent 130 receives an input including a description of each macro cluster to be placed on a chip canvas. Macro clustering is described in more detail with reference to FIG. 4A and FIG. 4B. The description of each macro cluster may be in the form of feature embedding. For each macro cluster, RL agent 130 performs neural network operations on the feature embedding and outputs an action for placing the macro cluster. RL agent 130 places the macro clusters one after another until all of the macro clusters are placed. To minimize wasted space, RL agent 130 may place the macro clusters with a small amount of overlap within a predetermined density threshold. The final state of the canvas is then evaluated by an environment 220 to produce a reward. The reward may include an estimate of measurements including wirelength and congestion of this placement. The operations of environment 220 may be performed by a computing system that runs a placement tool. The environment's evaluation result (i.e., the reward) is fed back to RL agent 130. After training for a number (e.g., a few thousands) of episodes, the best placement as determined by the rewards is selected and fed to post-processor 140 (FIG. 1). Further details on post-processor 140 will be provided with reference to FIG. 9.

Figure 3:
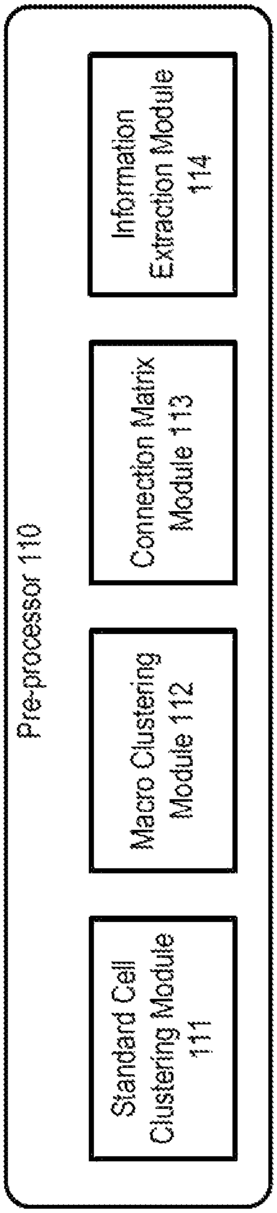
FIG. 3 is a block diagram illustrating an example of a pre-processor according to one embodiment.

FIG. 3 is a block diagram illustrating an example of pre-processor 110 according to one embodiment. In this embodiment, pre-processor 110 includes a standard cell clustering module 111 to cluster the standard cells into clusters, and a macro clustering module 112 to cluster the macros into macro clusters. The macros that are clustered into a macro cluster are in the same hardware hierarchy group and have the same footprint (i.e., the same width and height). Pre-processor 110 further includes a connection matrix module 113 to construct a connection matrix among standard cell clusters, macro clusters, and I/O ports. Pre-processor 110 further includes an information extraction module 114 to extract region and fence information. Macro clustering is further explained in detail with reference to FIG. 4A and FIG. 4B.

Figure 4B:
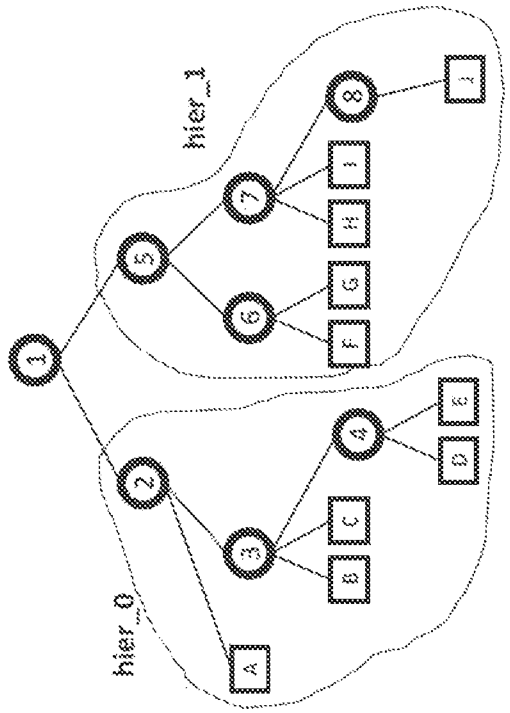
FIG. 4A and FIG. 4B illustrate examples of macro clustering operations according to one embodiment.
Figure 4A:
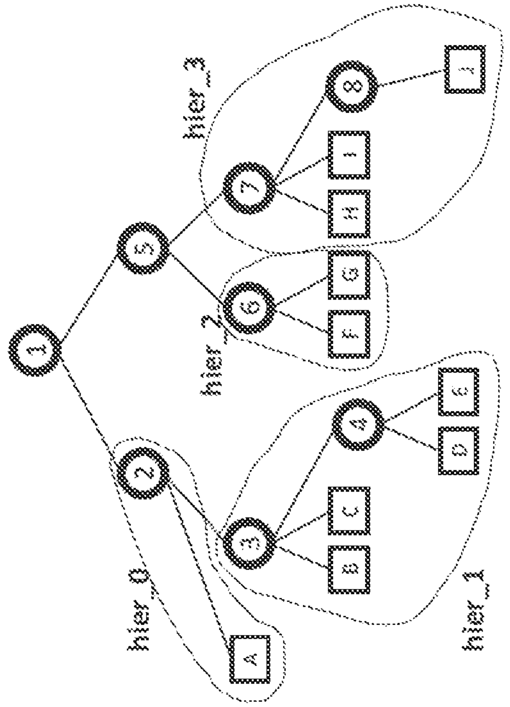

FIG. 4A and FIG. 4B illustrate examples of the operations performed by macro clustering module 112 according to one embodiment. Circuit designers may describe circuit blocks hierarchically in a hardware description language (HDL). In these examples, the macros are arranged hierarchically in a tree structure according to the hardware design hierarchies. Each leaf node (A-J) represents a macro. Initially, a number of hierarchy groups are formed. The number of macros in each hierarchy group cannot exceed a predetermined threshold. In FIG. 4A, the threshold is 40% of the total number of macros and four hierarchy groups are formed. In FIG. 4B, the threshold is 50% of the total number of macros and two hierarchy groups are formed. In one embodiment, macro clustering module 112 traverses the tree from the root (indicated as node 1) and determines, at each child node ("level-1 child node") of the root, whether or not a hierarchy group can include all of the leaf nodes in a subtree spanning from the level-1 child node without exceeding the threshold. If the threshold is exceeded, macro clustering module 112 checks each child node ("level-2 child node") of the level-1 child node to determine whether or not a hierarchy group can include all of the leaf nodes in a subtree spanning from the level-2 child node without exceeding the threshold. The process may continue towards the leaf level of the tree until hierarchy groups are formed to include all of the leaf nodes without exceeding the threshold.

After hierarchy groups are formed, the leaf nodes having the same width and height within the same hierarchy group form a cluster. Six and four macro clusters are formed in the examples of FIG. 4A and FIG. 4B, respectively.

Each macro cluster may have multiple possible shapes, such as rectangles with multiple possible aspect ratios. For example, if a macro cluster contains six macros, the aspect ratio may be chosen from 1×6, 6×1, 2×3, and 3×2. Thus, a macro cluster can also be referred to as a "flexible block," which is a circuit block having a fixed area and a flexible shape. The number of macros in a macro cluster may be subject to an upper limit. If a macro cluster contains more macros than this upper limit, the macro cluster may be split into several child macro clusters. In addition, a soft constraint is imposed in the RL agent's action to guide these child macro clusters to be close to each other in the placement. The output of pre-processor 110 is fed to feature extractor 120 (FIG. 1).

Figure 5:
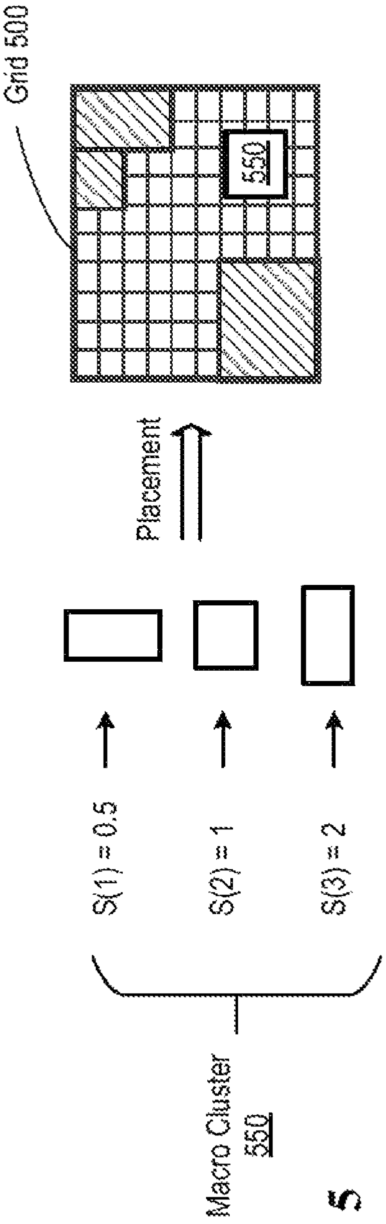
FIG. 5 is a diagram illustrating an example of macro placement according to one embodiment.

FIG. 5 is a diagram illustrating an example of macro placement according to one embodiment. In this example, a chip canvas is represented by a grid 500, which is formed by equal-sized grid cells organized in rows and columns. Each grid cell has a size of (1 unit length×1 unit length). The location of each grid cell is identified by (x, y), where x is the horizontal coordinate and y is the vertical coordinate. Initially, grid 500 is occupied by three blocks (indicated by blocks with slanted lines). Macro clusters are to be placed, one by one, in the remaining empty space of grid 500. When placing a macro cluster on grid 500, the center of the macro cluster is to coincide with the center of a grid cell. FIG. 5 shows that a macro cluster 550 is to be placed on grid 500. Macro cluster 550 has a given area size with three different aspect ratios, one of which can be chosen for placement. The aspect ratios for a macro cluster may be indicated by an array S(r), where r is referred to as an aspect ratio index. In this example, S(1)=0.5, S(2)=1, and S(3)=2. Referring to FIG. 1 and FIG. 2, RL agent 130 may choose an (x, y) coordinate and an aspect ratio index r for the placement of a macro cluster.

Figure 6:
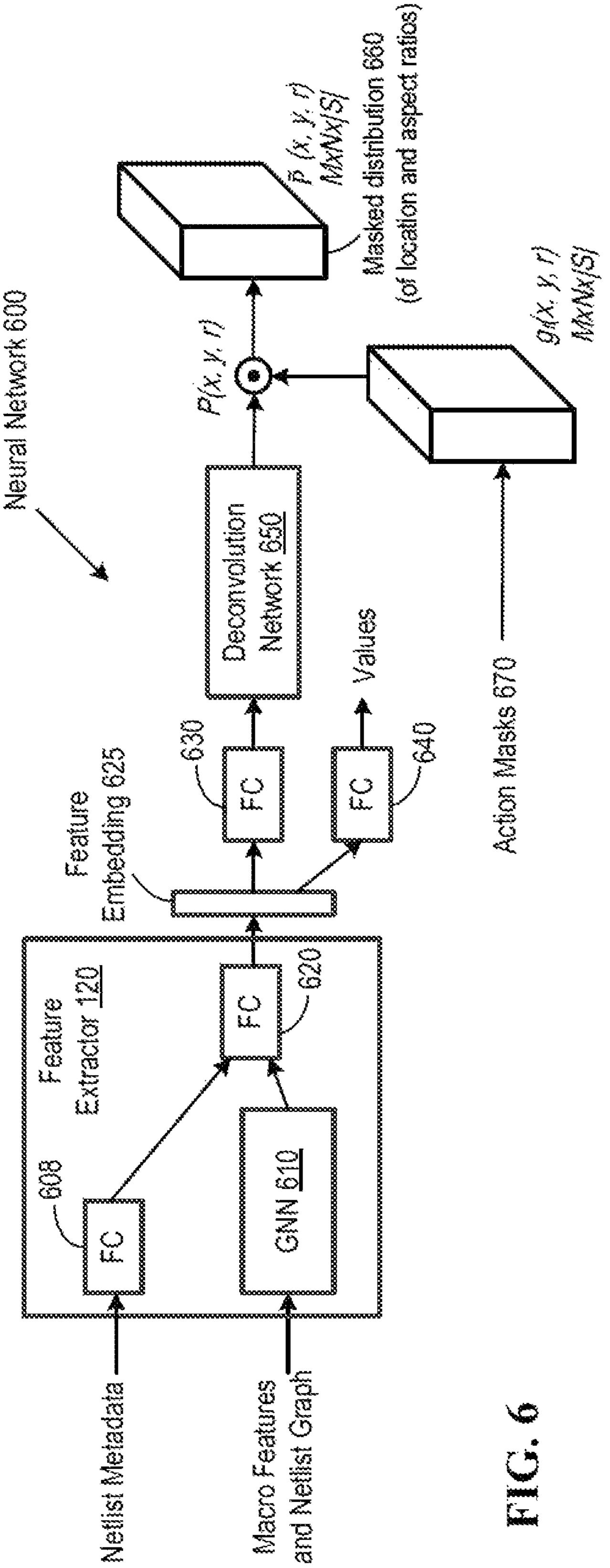
FIG. 6 is a diagram of a neural network architecture for macro placement according to one embodiment.

FIG. 6 is a diagram of a neural network architecture for macro placement according to one embodiment. The front end of a neural network (NN) 600 includes a feature extractor, such as feature extractor 120 in FIG. 1. Feature extractor 120 further includes a graph neural network (GNN) 610 to receive a netlist graph and macro features, and to generate a node embedding for each macro cluster to be placed and a graph embedding of the netlist. Feature extractor 120 also includes a fully-connected (FC) network 608 to receive netlist metadata and to generate a netlist metadata embedding. The outputs of GNN 610 and FC network 608 are fed into an FC network 620, which generates feature embedding 625; e.g., one or more low-dimension vectors representing the features extracted by feature extractor 120. An FC network 630 receives feature embedding 625 and sends the output to a multi-layered deconvolution network 650 to generate a probability distribution P(x, y, r) of an action. The probability distribution describes the probability of an action of placing a macro cluster with an aspect ratio index r on a grid coordinate (x, y). The action space, which is the space over which P(x, y, r) spans, is of size M×N×|S|, where M×N is the number of grid cells on the chip canvas, and |S| is the number of available aspect ratios of the macro cluster. The probability distribution P(x, y, r) is a joint probability of locations and aspect ratios. In one embodiment, a log joint probability of locations and aspect ratios log P(x, y, r) may be used. Thus, the action space of RL agent 130 (FIG. 1 and FIG. 2) is 3-dimensional, where all the possible locations on the canvas grid occupy the 2-D space (x, y), and all the possible aspect ratios for the macro cluster are in the third dimension.

In one embodiment, feature embedding 625 is also fed into an FC network 640 (also referred to as a value network). FC network 640 outputs a predicted reward value for a corresponding action. The predicted reward value is used to update the coefficients of neural network 600. For example, the neural network's coefficients can be updated using a Proximal Policy Optimization (PPO) gradient estimator with generalized advantage estimation.

For each macro cluster to be placed, multiple action masks may be generated to block out grid cells based on a density constraint. For density threshold=1, a grid cell is blocked out if placing a given macro cluster on the grid cell would cause the sum of occupied areas in the grid cell to exceed 1. Different action masks may be generated for the different aspect ratios of a given macro cluster. The action masks may be indicated by gt(x, y, r), which spans over a space of size M×N×|S|. When the action masks gt(x, y, r)=0, it means that the grid cell (x, y) is blocked for a flexible block with aspect ratio index r, and when gt(x, y, r)=1, it means that the grid cell (x, y) is not blocked for placing the flexible block with aspect ratio index r. A macro placement module such as macro placer 100 in FIG. 1 includes environment 220 (FIG. 2) to generate action masks. In one embodiment, macro placer 100 sets gt(x, y, r)=0 (i.e., blocked) if a macro cluster placed at the center of grid cell (x, y) with the r-th aspect ratio in set S causes the density of any grid cell to exceed the density threshold. Otherwise, macro placer 100 sets the action masks gt(x, y, r)=1 (i.e., not blocked).

The action masks gt(x, y, r) may be applied to the probability distribution P(x, y, r) to set the blocked areas to a zero probability value. A masked distribution P(x, y, r) 660 of size is M×N×|S| is calculated by applying action masks 670 to the probability distribution P(x, y, r). In one embodiment, masked distribution 660 spans over the action space formed by the valid placement locations and the available aspect ratios of a macro cluster. With a deterministic policy, the highest probability according to masked distribution 660 may be chosen to place the macro cluster. With a stochastic policy, an action may be sampled according to masked distribution 660.

In one embodiment, action masks are used to block out invalid placement locations that may cause severe macro overlapping (e.g., when the overlapping exceeds a threshold) or out-of-bound placement. Action masks are further used to block out undesired placement locations based on circuit designers' experiences and/or preferences.

Figure 7A:
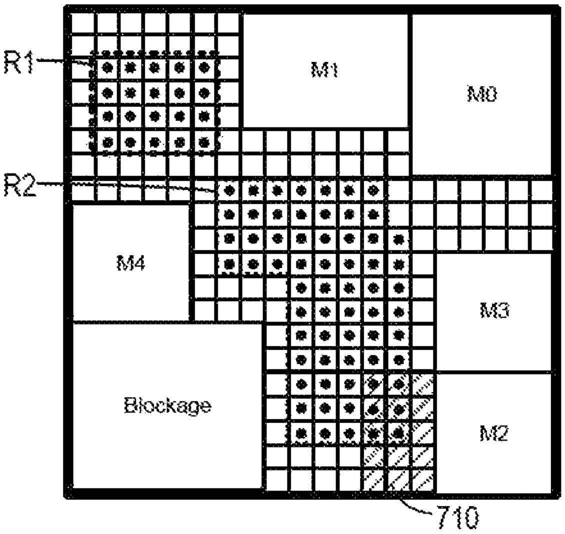
FIG. 7A, FIG. 7B, and FIG. 7C illustrate examples of action mask generation according to some embodiments.
Figure 7B:
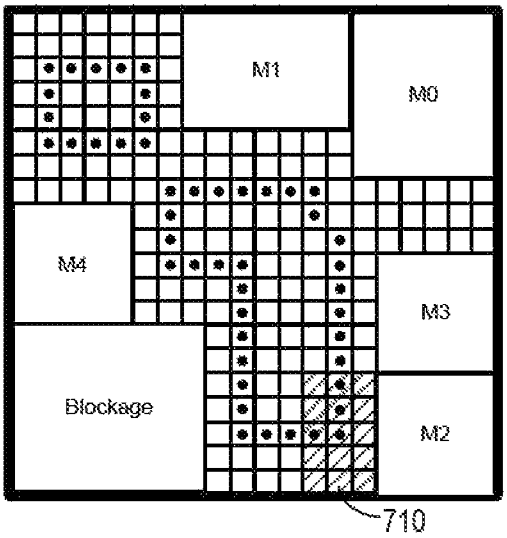
Figure 7C:
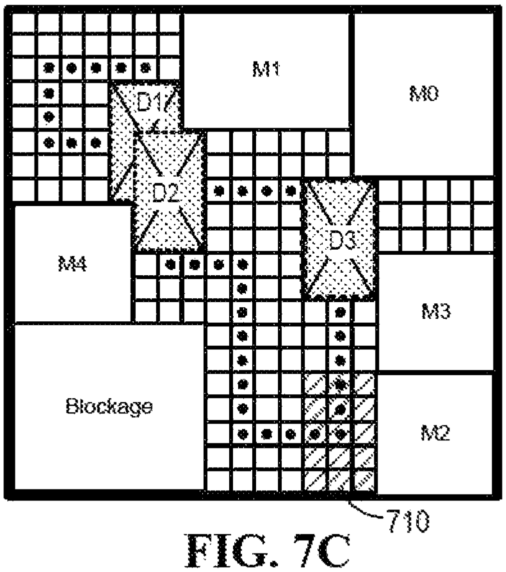

FIG. 7A, FIG. 7B, and FIG. 7C illustrate examples of action mask generation according to some embodiments. In the examples of FIG. 7A-FIG. 7C, macro clusters M0-M4 have been placed on a grid representing a chip canvas. The grid also includes a blockage area at the lower-left corner. The term "unoccupied locations" refers to grid locations that are not occupied by any of the already-placed macro clusters and the blockage. An action mask is generated to block out a set of grid cells for placing the macro cluster 710 (marked by a 5×3 rectangle with slanted lines). In these examples, the center of macro cluster 710 may be placed in any grid cell marked by a dot. The grid cells without a dot are blocked out by the action mask.

Figure 8:
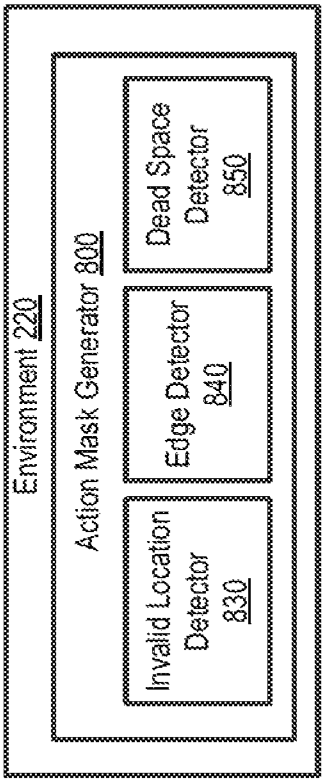
FIG. 8 is a block diagram of an action mask generator for generating action masks according to one embodiment.

FIG. 8 is a block diagram of an action mask generator 800 for generating action masks according to one embodiment. Action mask generator 800 generates action masks for the placement of each macro cluster of each available aspect ratio according to design rules that optimize macro placement. These design rules are also followed by human experts in circuit design. In one embodiment, action mask generator 800 may be part of environment 220 in FIG. 2, and environment 220 may be part of a macro placement module such as macro placer 100 in FIG. 1. Action mask generator 800 includes an invalid location detector 830, an edge detector 840, and a dead space detector 850. Invalid location detector 830 generates an initial action mask (represented by the blank grid cells in FIG. 7A) that blocks out overlapped and out-of-bound placement. In total, there are 85 candidate grid cells (each marked by a dot) that are valid for placement. These 85 candidate grid cells form two unconnected regions R1 and R2. Referring also to FIG. 7B, edge detector 840 checks the 85 dotted grid cells to detect edge grid cells in each region (R1, R2). The edge grid cells are preferred locations for macro placement. The non-edge grid cells in R1 and R2 are referred to as interior grid cells. Edge detector 840 adds the interior grid cells to the initial action mask, reducing the candidate grid cells from 85 to 46. The 46 grid cells are referred to as updated candidate grid cells. Referring also to FIG. 7C, dead space detector 850 examines the updated candidate grid cells to determine which locations may cause dead space. Dead space is an area on the chip canvas that is unusable by any circuit blocks. Dead space may be caused by the fragmentation of usable placement space into unconnected small areas. In this example, dead space detector 850 detects that placement locations marked by D1, D2, and D3 cause dead space and removes them from the 46 updated candidate grid cells, resulting in 43 target grid cells for placement. Thus, the action mask for the macro cluster 710 includes all of the grid cells that are not marked by a dot in FIG. 7C. It is noted that the examples shown in FIG. 7A-FIG. 7C are associated with the aspect ratio 5×3 of macro cluster 710. Macro cluster 710 may have multiple available aspect ratios. Action mask generator 800 generates one or more action masks for each aspect ratio of each macro cluster to be placed. In one embodiment, RL agent 130 (FIG. 1 and FIG. 2) selects the placement location under the constraints of the action masks according to the masked distribution P(x, y, r) 660 in FIG. 6.

After the placement of macro cluster 710, the state of the chip canvas is updated and the next macro cluster is to be placed on the updated canvas. After all macro clusters are placed, a reward is calculated. In one embodiment, the reward may be expressed as an objective function that minimizes the wirelength and congestion.

The placement process may iterate a predetermined number of times or for a predetermined time period, or when the reward has reached a steady state or a given goal. After neural network 600 (FIG. 6) is trained with a training set, the trained neural network can be used in an inference stage to place macro clusters on a given chip canvas.

Figure 9:
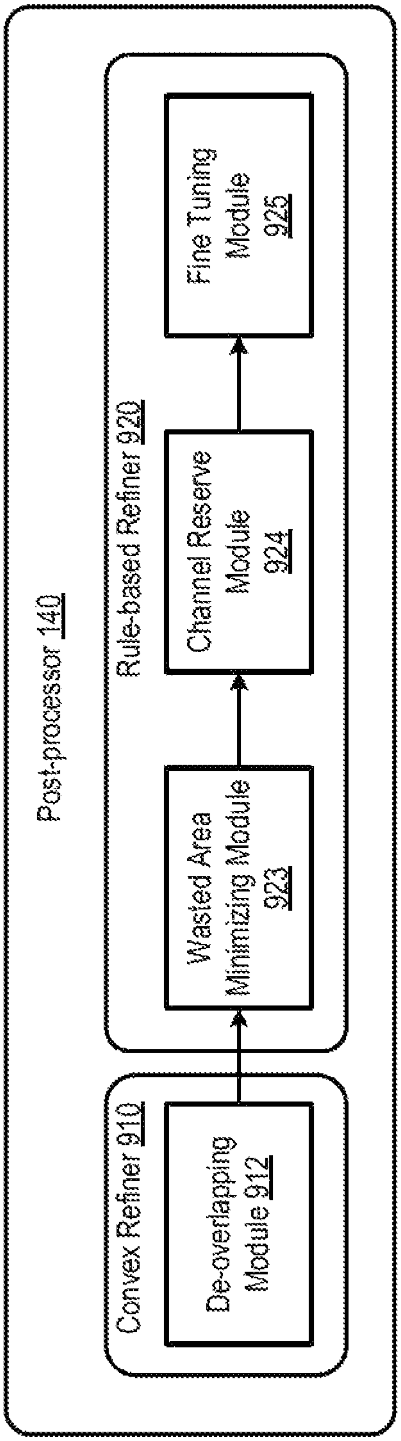
FIG. 9 is a block diagram illustrating a post-processor according to one embodiment.

FIG. 9 is a block diagram illustrating post-processor 140 of FIG. 1 according to one embodiment. Post-processor 140 includes a convex refiner 910 and a rule-based refiner 920. In some embodiments, the macro placement by RL agent 130 (FIG. 1 and FIG. 2) allows certain overlapping among the macro clusters to avoid wasted space. To legalize the placement from the RL agent's output, the position-refinement problem can be formulated as an optimization problem, in which the objective is to minimize total macro displacement while satisfying non-overlapping constraints for all macro connections in each horizontal constraint graph (HCG) and for all macro connections in each vertical constraint graph (VCG). The HCG and the VCG are determined from the placement results of RL agent 130. Definitions of the HCG and the VCG can be found, for example, in "Floorplanning" by T.-C. Chen and Y.-W. Chang, Electronic Design Automation: Synthesis, Verification, and Test, San Francisco, CA, USA: Morgan Kaufmann, 2009, chapter 10, pp. 575-634. This optimization problem can be formulated into a convex optimization problem and thus can be efficiently solved by known techniques for convex optimization. In one embodiment, convex refiner 910 includes a de-overlapping module 912 to remove the overlapping among the macro clusters. An example of the operations performed by de-overlapping module 912 is shown in FIG. 10.

After the convex optimization, the locations of macro clusters are further refined by rule-based refiner 920. Referring to FIG. 9, rule-based refiner 920 includes a wasted area minimizing module 923, a channel reserve module 924, and a fine-tuning module 925, each of which operates according to a set of predefined rules. In one embodiment, the operations performed by wasted area minimizing module 923 are as follows. For each macro cluster, wasted area minimizing module 923 checks whether or not there is a wasted area between the macro cluster and the chip canvas boundary. A wasted area is an unused chip canvas space. If there is a wasted area, wasted area minimizing module 923 moves the macro cluster toward the canvas boundary to reduce the wasted area; otherwise, the macro cluster stays at the same location.

The space between two adjacent macro clusters on a chip canvas is called channel spacing. Channel spacing is reserved for routing and buffer insertion between macro clusters to avoid timing violations. In one embodiment, the operations performed by channel reserve module 924 are as follows. For each given macro cluster, channel reserve module 924 calculates the distance from the given macro cluster to the nearest available channel. If the distance is greater than a predetermined threshold, channel reserve module 924 identifies a gap between two adjacent macro clusters, where the gap is the farthest gap from the given macro cluster and the distance from the given macro cluster to the gap is less than the predetermined threshold. Channel reserve module 924 then inserts a channel for routing and buffer insertion at the identified gap.

In one embodiment, fine-tuning module 925 inspects the placement of each macro cluster to ensure that the placement meets the CIC rules and design rule check (DRC) rules as required by the chip foundry. For each macro cluster, fine-tuning module 925 determines whether or not the spacing between the macro cluster and the canvas boundary and the spacing between the macro cluster and its adjacent macro cluster(s) comply with the respective requirements according to the CIC and DRC rules. Fine-tuning module 925 moves the macro cluster if the rules are violated.

The disclosed learning-based macro placer not only digests gate-level connection information, but also follows backend physical design principles when creating macro placement. By clustering the standard cells and macros, exploiting their connection signatures, exploring 3-D placement algorithms, incorporating physical design principles, and leveraging convex optimization and a rule-based refiner, the learning-based macro placer can place hundreds of macros in a few hours with the quality of human experts. In addition, the learning-based macro placer has the ability to learn from each placement project. Thus, the learning-based macro placer can accelerate and automate the physical design process.

Figure 11:
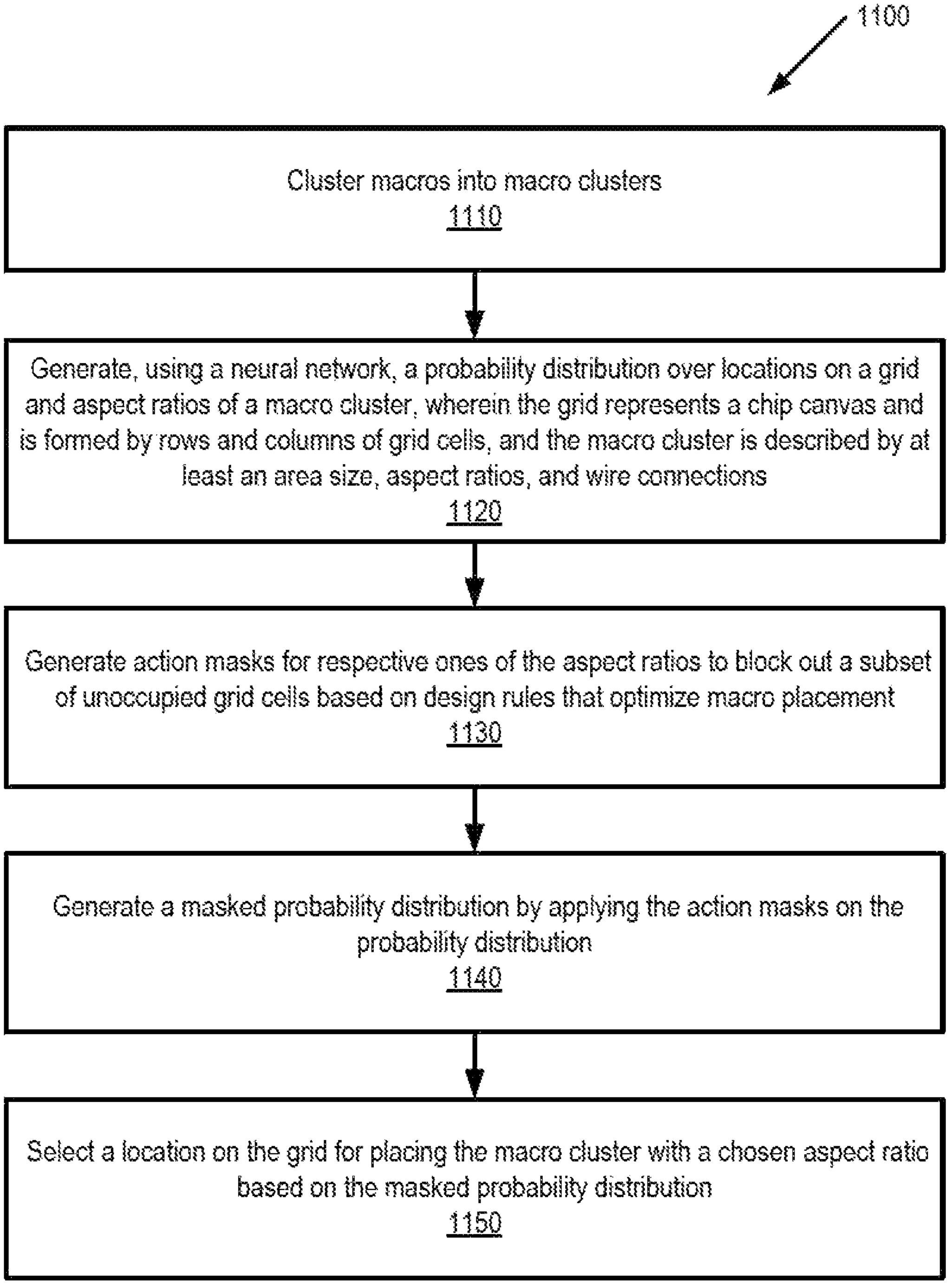
FIG. 11 is a flow diagram illustrating a method for placing macros on a chip canvas in an IC design according to one embodiment.

FIG. 11 is a flow diagram illustrating a method 1100 for placing macros on a chip canvas in an IC design according to one embodiment. In one embodiment, a neural network (e.g., neural network 600 in FIG. 6) is used to calculate a probability distribution of placement locations and aspect ratios. In one embodiment, method 1100 may be performed by a computing system such as a system 1200 in FIG. 12.

Method 1100 starts with step 1110 at which the system clusters the macros into macro clusters. At step 1120, the system uses a neural network to generate a probability distribution over locations on a grid and aspect ratios of a macro cluster. The grid represents a chip canvas and is formed by rows and columns of grid cells. The macro cluster is described by at least an area size, aspect ratios, and wire connections. The system at step 1130 generates action masks for respective aspect ratios to block out a subset of unoccupied grid cells based on design rules that optimize macro placement. The system at step 1140 generates a masked probability distribution by applying the action masks on the probability distribution. The system at step 1150 selects a location on the grid for placing the macro cluster with a chosen aspect ratio based on the masked probability distribution.

In one embodiment, the system detects edge grid cells in a region of the grid, where each grid cell in the region is valid for placement. The system then removes non-edge grid cells from candidate grid cells to generate updated candidate grid cells. The system further detects one or more dead-space grid cells among the updated candidate grid cells. Placement of the macro cluster on any of the dead-space grid cells causes fragmentation of usable placement space in the grid. The system then removes the one or more dead-space grid cells from the updated candidate grid cells to generate target grid cells. The system generates an action mask that blocks out all grid cells in the grid except the target grid cells.

In one embodiment, the macros having a same height and width and in a same hardware hierarchy group are clustered into a macro cluster. When forming hardware hierarchy groups, each macro is a leaf node in a tree structure that describes a hierarchical hardware design. Then the tree structure is partitioned into hardware hierarchy groups with the number of macros in each hardware hierarchy group subject to an upper limit. In one embodiment, the neural network is an RL neural network that receives a reward for placing the macros on the grid. The reward is a measurement of wirelength and congestion of the placement.

In one embodiment, after placing all of the macro clusters on the grid, the system may apply a convex refiner to overlapping macro clusters to minimize a total macro displacement while satisfying a non-overlapping constraint for all of the macro clusters. The system may further apply a rule-based refiner to minimize wasted areas between adjacent macro clusters and between a chip canvas boundary and each macro cluster. The system may further apply a rule-based refiner to reserve channel space for each macro cluster. The system may further apply a rule-based refiner to enforce requirements of foundry process technologies with respect to spacing between adjacent macro clusters and spacing between a chip canvas boundary and the macro clusters.

Figure 12:
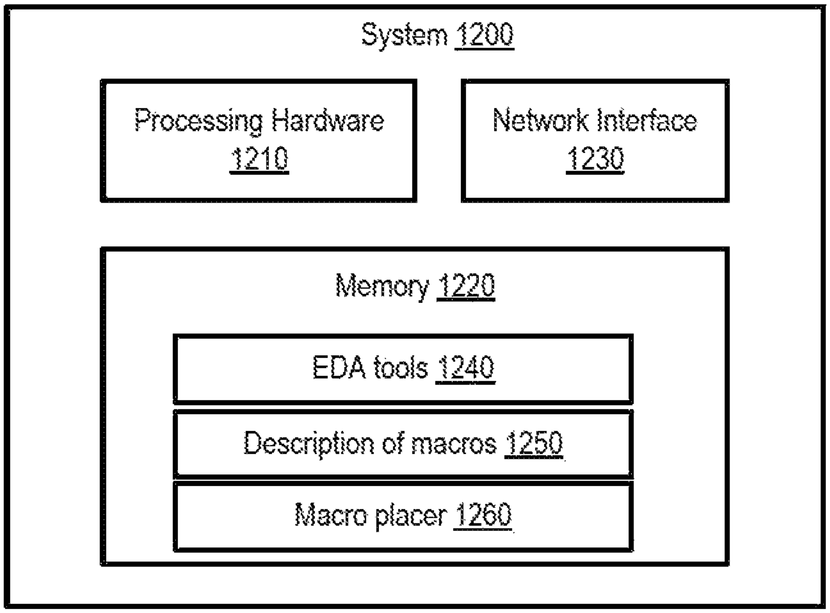
FIG. 12 is a block diagram illustrating a system operative to perform macro placement according to one embodiment.

FIG. 12 is a block diagram illustrating a system 1200 operative to perform macro placement according to one embodiment. System 1200 includes processing hardware 1210, a memory 1220, and a network interface 1230. In one embodiment, processing hardware 1210 may include one or more processors and accelerators, such as one or more of: a central processing unit (CPU), a GPU, a digital processing unit (DSP), an AI processor, a tensor processor, a neural processor, a multimedia processor, other general-purpose and/or special-purpose processing circuitry.

System 1200 further includes memory 1220 coupled to processing hardware 1210. Memory 1220 may include memory devices such as dynamic random access memory (DRAM), SRAM, flash memory, and other non-transitory machine-readable storage media; e.g., volatile or non-volatile memory devices. Memory 1220 may further include storage devices, for example, any type of solid-state or magnetic storage device. In one embodiment, memory 1220 may store one or more EDA tools 1240 and a macro placer including but not limited to a neural network 1260 (e.g., neural network 600 in FIG. 6). The macro placer may include an RL agent (e.g., RL agent 130 in FIG. 1 and FIG. 2) and an environment (e.g., environment 220 in FIG. 2). Memory 1220 may further store descriptions of macros 1250 placed or to be placed on a chip canvas and parameters of neural network 1260. In some embodiments, memory 1220 may store instructions which, when executed by processing hardware 1210, cause the processing hardware to perform the aforementioned methods and operations for macro placement and/or for training a neural network to perform macro placement.

In some embodiments, system 1200 may also include a network interface 1230 to connect to a wired and/or wireless network. It is understood the embodiment of FIG. 12 is simplified for illustration purposes. Additional hardware components may be included.

The operations of the flow diagram of FIG. 11 have been described with reference to the exemplary embodiments of FIG. 6 and FIG. 12. However, it should be understood that the operations of the flow diagram of FIG. 11 can be performed by embodiments of the invention other than the embodiments of FIG. 6 and FIG. 12, and the embodiments of FIG. 6 and FIG. 12 can perform operations different than those discussed with reference to the flow diagram. While the flow diagram of FIG. 11 shows a particular order of operations performed by certain embodiments of the invention, it should be understood that such order is exemplary (e.g., alternative embodiments may perform the operations in a different order, combine certain operations, overlap certain operations, etc.).

Various functional components or blocks have been described herein. As will be appreciated by persons skilled in the art, the functional blocks will preferably be implemented through circuits (either dedicated circuits or general-purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method of placing macros by a neural network on a chip canvas in an integrated circuit (IC) design, comprising:

clustering the macros into a plurality of macro clusters including a given macro cluster, each macro cluster being a flexible circuit block defined by a fixed area with a variable aspect ratio selectable from a plurality of aspect ratios, each aspect ratio defined by a ratio of width to height of the flexible circuit block, and the given macro cluster is described by at least an area size, a given set of aspect ratios, and wire connections;

generating, using the neural network, a joint probability distribution of three dimensions over two-dimensional locations on a grid and the given set of aspect ratios of the given macro cluster, wherein the grid represents the chip canvas and is formed by rows and columns of grid cells;

generating a masked probability distribution by applying action masks to the joint probability distribution, each action mask indicating a subset of unoccupied grid cells on the grid and one of the aspect ratios in the given set; and selecting a location on the grid for placing the given macro cluster with a chosen aspect ratio based on the masked probability distribution.

2. The method of claim 1, wherein generating the action masks further comprises:

detecting edge grid cells in a region of the grid, wherein each grid cell in the region is valid for placement; and removing non-edge grid cells from candidate grid cells to generate updated candidate grid cells.

3. The method of claim 2, wherein generating the action masks further comprises:

detecting one or more dead-space grid cells among the updated candidate grid cells, wherein placement of the macro cluster on any of the dead-space grid cells causes fragmentation of usable placement space in the grid;

removing the one or more dead-space grid cells from the updated candidate grid cells to generate target grid cells; and generating an action mask that blocks out all grid cells in the grid except the target grid cells.

4. The method of claim 1, further comprising:

clustering the macros having a same width and height and in a same hardware hierarchy group into a macro cluster.

5. The method of claim 4, wherein each macro is a leaf node in a tree structure that describes a hierarchical hardware design, the tree structure is partitioned into a plurality of hardware hierarchy groups with the number of macros in each hardware hierarchy group subject to an upper limit.

6. The method of claim 1, wherein the neural network is a reinforcement learning (RL) neural network that receives a reward for placement of the macros on the grid, and wherein the reward is a measurement of wirelength and congestion of the placement.

7. The method of claim 1, further comprising:

after placement of all of the macro clusters on the grid, applying a convex refiner to overlapping macro clusters to minimize a total macro displacement while satisfying a non-overlapping constraint for all of the macro clusters.

8. The method of claim 1, further comprising:

after placement of all of the macro clusters on the grid, applying a rule-based refiner to minimize wasted areas between adjacent macro clusters and between a chip canvas boundary and each macro cluster.

9. The method of claim 1, further comprising:

after placement of all of the macro clusters on the grid, applying a rule-based refiner to reserve channel space for each macro cluster.

10. The method of claim 1, further comprising:

after placement of all of the macro clusters on the grid, applying a rule-based refiner to enforce requirements of foundry process technologies with respect to spacing between adjacent macro clusters and spacing between a chip canvas boundary and the macro clusters.

11. A system for placing macros on a chip canvas in an integrated circuit (IC) design, comprising:

memory to store descriptions of the macros; and one or more processors coupled to the memory, at least one of the processors operative to perform operations of a neural network, wherein the one or more processors are operative to:

cluster the macros into a plurality of macro clusters including a given macro cluster, each macro cluster being a flexible circuit block defined by a fixed area with a variable aspect ratio selectable from a plurality of aspect ratios, each aspect ratio defined by a ratio of width to height of the flexible circuit block, and the given macro cluster is described by at least an area size, a given set of aspect ratios, and wire connections;

generate, using the neural network, a joint probability distribution of three dimensions over two-dimensional locations on a grid and the given set of aspect ratios of the given macro cluster, wherein the grid represents the chip canvas and is formed by rows and columns of grid cells;

generate a masked probability distribution by applying action masks to the joint probability distribution, each action mask indicating a subset of unoccupied grid cells on the grid and one of the aspect ratios in the given set; and select a location on the grid for placing the given macro cluster with a chosen aspect ratio based on the masked probability distribution.

12. The system of claim 11, wherein the one or more processors are further operative to:

detect edge grid cells in a region of the grid, wherein each grid cell in the region is valid for placement; and remove non-edge grid cells from candidate grid cells to generate updated candidate grid cells.

13. The system of claim 12, wherein the one or more processors are further operative to:

detect one or more dead-space grid cells among the updated candidate grid cells, wherein placement of the macro cluster on any of the dead-space grid cells causes fragmentation of usable placement space in the grid;

remove the one or more dead-space grid cells from the updated candidate grid cells to generate target grid cells; and generate an action mask that blocks out all grid cells in the grid except the target grid cells.

14. The system of claim 11, wherein the one or more processors are further operative to:

cluster the macros having a same width and height and in a same hardware hierarchy group into a macro cluster.

15. The system of claim 14, wherein each macro is a leaf node in a tree structure that describes a hierarchical hardware design, the tree structure is partitioned into a plurality of hardware hierarchy groups with the number of macros in each hardware hierarchy group subject to an upper limit.

16. The system of claim 11, wherein the neural network is a reinforcement learning (RL) neural network that receives a reward for placement of the macros on the grid, and wherein the reward is a measurement of wirelength and congestion of the placement.

17. The system of claim 11, wherein the one or more processors are further operative to:

after placement of all of the macro clusters on the grid, apply a convex refiner to overlapping macro clusters to minimize a total macro displacement while satisfying a non-overlapping constraint for all of the macro clusters.

18. The system of claim 11, wherein the one or more processors are further operative to:

after placement of all of the macro clusters on the grid, apply a rule-based refiner to minimize wasted areas between adjacent macro clusters and between a chip canvas boundary and each macro cluster.

19. The system of claim 11, wherein the one or more processors are further operative to:

after placement of all of the macro clusters on the grid, apply a rule-based refiner to reserve channel space for each macro cluster.

20. The system of claim 11, wherein the one or more processors are further operative to:

after placement of all of the macro clusters on the grid, apply a rule-based refiner to enforce requirements of foundry process technologies with respect to spacing between adjacent macro clusters and spacing between a chip canvas boundary and the macro clusters.

* * * * *